United States Patent
Bhattacharya

(10) Patent No.: US 7,297,868 B2
(45) Date of Patent: Nov. 20, 2007

(54) PREPARATION OF CIGS-BASED SOLAR CELLS USING A BUFFERED ELECTRODEPOSITION BATH

(75) Inventor: Raghu Nath Bhattacharya, Littleton, CO (US)

(73) Assignee: Davis, Joseph & Negley, Mill Valley, CA (US)

( * ) Notice: Subject to any disclaimer, the term of this patent is extended or adjusted under 35 U.S.C. 154(b) by 813 days.

(21) Appl. No.: 10/627,322

(22) Filed: Jul. 25, 2003

(65) Prior Publication Data
US 2004/0206390 A1    Oct. 21, 2004

Related U.S. Application Data

(63) Continuation of application No. 09/829,730, filed on Apr. 10, 2001, now abandoned.

(60) Provisional application No. 60/195,956, filed on Apr. 10, 2000.

(51) Int. Cl.
*H01L 31/00* (2006.01)
(52) U.S. Cl. ............... 136/262; 136/264; 136/265; 205/239; 205/316
(58) Field of Classification Search ........ 136/262, 136/264
See application file for complete search history.

(56) References Cited

U.S. PATENT DOCUMENTS

| | | | | |
|---|---|---|---|---|
| 4,686,323 A | * | 8/1987 | Biter et al. | 136/249 |
| 5,032,236 A | * | 7/1991 | Saitou et al. | 205/138 |
| 5,141,564 A | * | 8/1992 | Chen et al. | 136/258 |
| 5,556,534 A | * | 9/1996 | Alcock et al. | 205/787.5 |
| 5,730,852 A | * | 3/1998 | Bhattacharya et al. | 205/192 |
| 5,804,054 A | * | 9/1998 | Bhattacharya et al. | 205/239 |
| 5,871,630 A | * | 2/1999 | Bhattacharya et al. | 205/192 |
| 6,040,521 A | * | 3/2000 | Kushiya et al. | 136/265 |

FOREIGN PATENT DOCUMENTS

| | | |
|---|---|---|
| EP | 0 838 864 A2 | 4/1998 |
| EP | 838864 A2 * | 4/1998 |
| EP | 0 841 706 A2 | 5/1998 |
| EP | 841706 A2 * | 5/1998 |
| EP | 0 881 695 A2 | 12/1998 |
| EP | 881695 A2 * | 12/1998 |

OTHER PUBLICATIONS

Lowenheim, F.A., "Electroplating". New York: McGraw-Hill Book Company. (1978) p. 120, 121, and 512-519.*

(Continued)

*Primary Examiner*—Edna Wong
*Assistant Examiner*—Jeffrey Barton
(74) *Attorney, Agent, or Firm*—Louis C. Cullman; Kirkpatrick & Lockhart Preston Gates Ellis LLP

(57) ABSTRACT

A photovoltaic cell exhibiting an overall conversion efficiency of at least 9.0% is prepared from a copper-indium-gallium-diselenide thin film. The thin film is prepared by simultaneously electroplating copper, indium, gallium, and selenium onto a substrate using a buffered electro-deposition bath. The electrodeposition is followed by adding indium to adjust the final stoichiometry of the thin film.

12 Claims, 4 Drawing Sheets

OTHER PUBLICATIONS

J.-L. Liang et al, "Amine-Quinone Polyurethanes as Binders for Metal Particle Tape", IEEE Trans. Magnet. 29, 3649-3651. (1993).*

L.S. Kegeles, "Stability of [123I]IBZM SPECT Measurement of Amphetamine-Induced Striatal Dopamine Release in Humans", Synapse. 31, 302-308. (Feb. 1999).*

Yukawa et al. "Electrodeposition of CuInS2 from aqueous solution (II) Electrodeposition of CuInS2 film" Thin Film Solids 286 (1996) pp. 151-153.*

Yukawa et al.; Electrodeposition of $CuInS_2$ from aqueous solution (II) electrodeposition of $CuInS_2$ film; Thin Solid Films 286 (1996) 151-153.

* cited by examiner

US 7,297,868 B2

PREPARATION OF CIGS-BASED SOLAR CELLS USING A BUFFERED ELECTRODEPOSITION BATH

RELATED APPLICATIONS

This application is a continuation of patent application Ser. No. 09/829,730 filed Apr. 10, 2001, now abandoned which claims the benefit of U.S. Provisional Patent Application Ser. No. 60/195,956, filed Apr. 10, 2000, and whose entire contents are hereby incorporated by reference.

REFERENCE TO GOVERNMENT

This invention was made with Government support under NREL-WFO-1326, Prime contract No. DE-AC36-83CH10093 awarded by the Department of Energy. The Government has certain rights in this invention.

FIELD OF INVENTION

The present invention relates to preparation of thin film photovoltaic solar cells. More particularly, the present invention relates to the fabrication of photovoltaic thin film by the simultaneous electro-deposition of copper, indium, gallium, and selenium onto a substrate.

BACKGROUND OF THE INVENTION

The most important components of photovoltaic cells are the semiconductor layers. The semiconductor layers are where sunlight is converted into electrical energy. More particularly, semiconductors harness the energy from sunlight and convert it into electrical energy. Sunlight is composed of particles of energy known as photons. These photons contain different amounts of energy depending upon the wavelength of light. The entire wavelength spectrum of sunlight from infrared to ultraviolet light has an energy range of 0.5 eV to 2.9 eV, respectively. When these photons hit the surface of the solar cell, the photons may be absorbed, reflected, or pass through the solar cell. The energy from those photons that are absorbed by the semiconductor atoms is transferred to the atoms' electrons. The added energy from the photons excite the electrons within the solar cells thereby enabling the electrons to break away from their associated atoms and become part of the electrical current. The amount of energy required to "liberate" the electrons from their atomic bonds to produce electrical current is known as the band-gap energy. Different semiconductor materials have differing band-gap energies. In order to liberate these electrons from their atomic bonds, a photon must have an energy equal to the band-gap energy. If the photon of light lacks sufficient energy, the photon passes through the material or generates heat. Given the particular energies required to generate an electrical current, approximately 55% of the sunlight's energy cannot be utilized. Furthermore, there is no one ideal material that may be used to capture energy from the sunlight's broad energy spectrum. Thus, there has been a desire to find semiconductor materials with broad band-gap energies.

Traditionally, the semiconductor layer of photovoltaic solar cells has been made from crystalline silicon. Crystalline silicon is used in many forms such as monocrystalline, multi-crystalline, ribbon and sheet, and thin layer silicon. Typically, crystalline silicon solar cells are made of silicon wafers having a thickness ranging from 150-350 microns. Various methods are known for the production of crystalline silicon such as the Czochralski method, float zone method, casting, die or wiring pulling. Silicon-based solar cells are expensive because a large amount of raw material is required and the necessity to remove impurities and defects from the silicon. Techniques such as passivation (reacting surface with hydrogen) and gettering (chemical heat treatment that causes impurities to diffuse out of silicon) have been developed to address the problem of impurities and defects. Moreover, silicon has a band gap energy of 1.1 eV which is at the lower range of effective semiconductors. Furthermore, advancements in the use of crystalline silicon in solar cells has resulted in an increasing demand for solar grade silicon, yet the availability of such silicon is dwindling.

As a result, other semiconductor materials and technologies that may be utilized for fabricating solar cells have been sought out. In particular, thin film photovoltaic cells has garnered considerable attention and study in recent years. These cells are made of semiconductor materials that are only a few micrometers in thickness. Typically, these cells are comprised of two semiconductor layers. The two layers have different characteristics in order to create an electrical field and a resultant electrical current. The first thin film layer is commonly referred to as the "window" layer or negative type (n-type) semiconductor. The window layer absorbs high energy light energy, but it must also be thin as to let light pass through the n-type layer to the second semiconductor layer, the absorbing layer. The absorbing layer or positive type (p-type) layer must have a suitable band gap to absorb photons and generate high current and good voltage. Thus, less semiconductor material is required thereby reducing the costs of producing solar cells as compared to crystalline solar cells. Thin film photovoltaic cells have been developed using semiconductor materials such as amorphous silicon, cadmium telluride, and copper-indium-diselenide (CIS), and copper-indium-gallium-diselenide (CIGS).

In particular, CIGS has gained considerable interest and study in recent years. The focus of research with respect to CIGS has concentrated on developing low-cost manufacturing techniques for thin film CIGS. For instance, some of the earliest techniques involved selenization, which is the process of heating copper and indium on a substrate in the presence of a selenium gas. A drawback of this process is selenium-containing gas such as $H_2Se$ is highly toxic and presents a great health risk to humans in large scale production environments.

Other techniques used to form CIGS thin films includes sputtering techniques and physical vapor deposition (PVD). U.S. Pat. No. 5,045,409 issued to Eberspacher et al. discloses the deposition of copper and indium films by magnetron sputter and deposition of a selenium film by thermal evaporation in the presence of various gases. Methods such as PVD of single crystals and polycrystalline films yield highly efficient solar cells, but PVD is very expensive and difficult to scale up for large scale production. Thus, there is a need for producing inexpensive methods of producing highly efficient CIGS films for photovoltaic cells in large scale.

BRIEF SUMMARY OF THE INVENTION

Accordingly, it is a general object of the present invention to provide an improved process for the simultaneous electrodeposition of copper-indium-gallium-diselenide thin films to be used in the fabrication of photovoltaic solar cells.

Another object of the present invention is to provide a chemical bath that stabilizes the electro-deposition process and minimizes the production of metal oxides or hydroxide precipitates.

It is yet another object of the present invention to provide a process that deposits greater concentrations of gallium in a more uniform matter in the electro-deposition of copper-indium-gallium-diselenide thin films.

Still another object of the present invention is to provide an electro-deposition process that effectively utilizes source materials and minimizes waste generation.

Another object of the present invention is to provide a low cost electro-deposition process that produces highly efficient copper-indium-gallium-diselenide thin films that are efficient and have low-cost.

It is yet another object of the present invention to provide an electro-deposition process that requires minimal, if any, additional physical vapor deposition processing.

The present invention is related to thin film photovoltaic devices and methods of fabricating the same. In particular, the photovoltaic device of the present invention comprises a plurality of semiconductor layers, wherein one semiconductor layer includes a copper-indium-gallium-diselenide film having a band gap ranging from 1.1-1.45 eV. The photovoltaic device made in accordance with teachings of the pr-sent invention has the following performance parameters: a conversion efficiency of at least 9.0%; an open circuit voltage of at least 0.4 V; a current of at least 30 mA/cm$^2$; and a fill factor of at least 58%.

The present invention provides an inexpensive method of fabricating efficient copper-indium-gallium-diselenide (CIGS) thin films. According to one method of the present invention, a copper, indium, gallium, diselenide film layer is simultaneously deposited on a substrate by electro-deposition, wherein the substrate is placed within a buffered electro-deposition bath. The buffered bath allows for more uniform and consistent gallium deposition.

According to another method of the present invention, CIGS film is deposited on a substrate by a two step process. In the first step, copper, indium, gallium, and selenium ions are simultaneously electro-deposited onto a substrate using a buffered electro-deposition bath. The second step comprises the deposition of indium by physical vapor deposition.

DETAILED DESCRIPTION OF THE INVENTION

The present invention relates to photovoltaic cells and method to making photovoltaic cells. In particular, the present invention is directed to copper-indium-gallium-diselenide (CIGS) based solar cells that can be manufactured inexpensively. An exemplary method of the present invention is essentially a two step process. In the first step, a film of copper-indium-gallium-selenium is electro-deposited on a substrate. The second step comprises the deposition of indium by physical vapor deposition.

Figure 1:
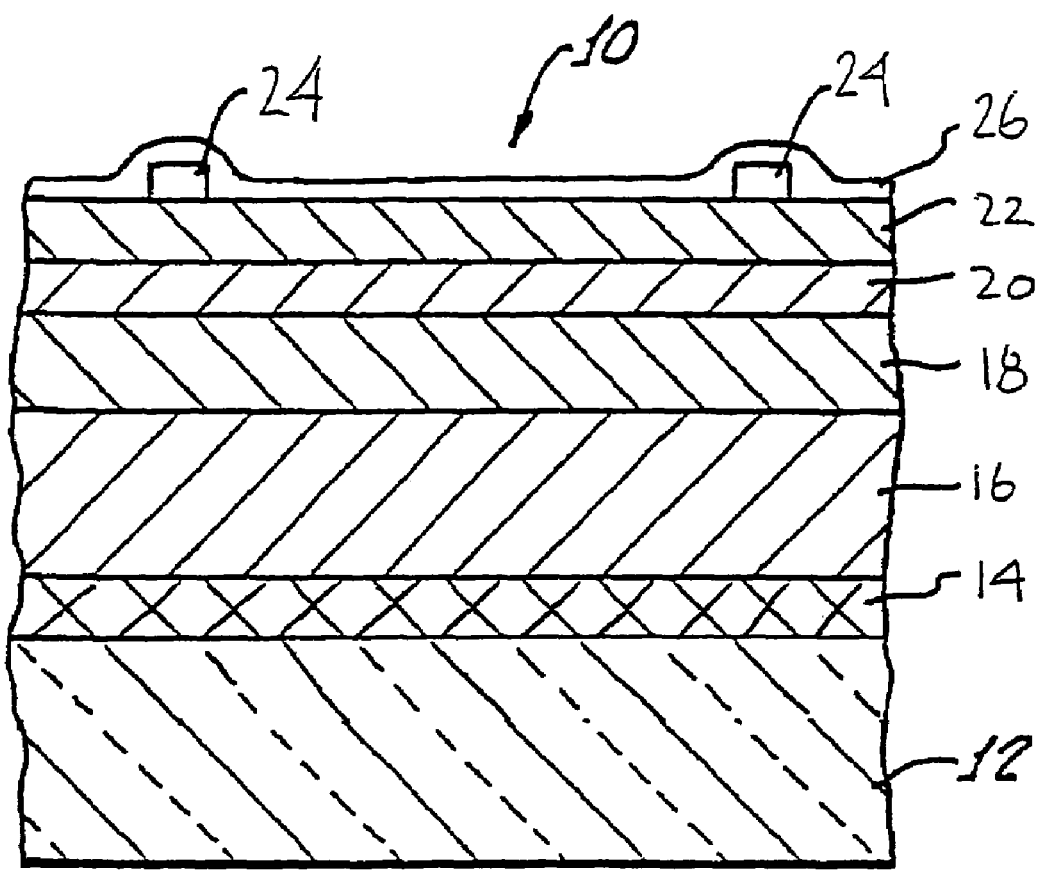
FIG. 1 depicts a cross sectional view of a CIGS photovoltaic device prepared according to the teachings of the present invention.

Referring more particularly to the Figures, FIG. 1 illustrates the various layer of a photovoltaic cell 10 made according to the methods of the current invention. The precursor layer 16 is applied to a substrate 12 such as, but not limited to, soda-lime silica glass or amorphous 7059 glass. A molybdenum layer 14 or copper layer may be applied to the substrate layer 12 in order to provide greater adhesion to the precursor layer 16. The molybdenum layer 14 is deposited on the substrate by direct current (DC) sputtering and is at least 0.3 micron thick. In another embodiment of the present invention, the molybdenum layer is 1 micron thick.

As shown in FIG. 1, a precursor layer 16 is applied to the molybdenum layer. The precursor layer 16 composition is approximately 26% copper atoms, 16% indium atoms, 9% gallium atoms and 48% selenium atoms. More particularly, the precursor composition is 26.18% copper atoms, 16.44% indium atoms, 9.43% gallium atoms and 47.95% selenium atoms. Those skilled in the art will appreciate that the aforementioned precursor composition values are exemplary and in no way intended to be limiting.

According to the teachings of the present invention, the precursor layer is applied to the substrate by an electro-deposition process. In general, an electro-deposition bath is provided having metal ions dissolved therein. A DC source is applied to the deposition bath which causes the positive ions to travel toward the cathode and the negative ions to travel toward the anode. With the substrate attached to the cathode, the metal ions dissolved in the electro-deposition bath of the present invention are plated on the substrate.

Figure 4:
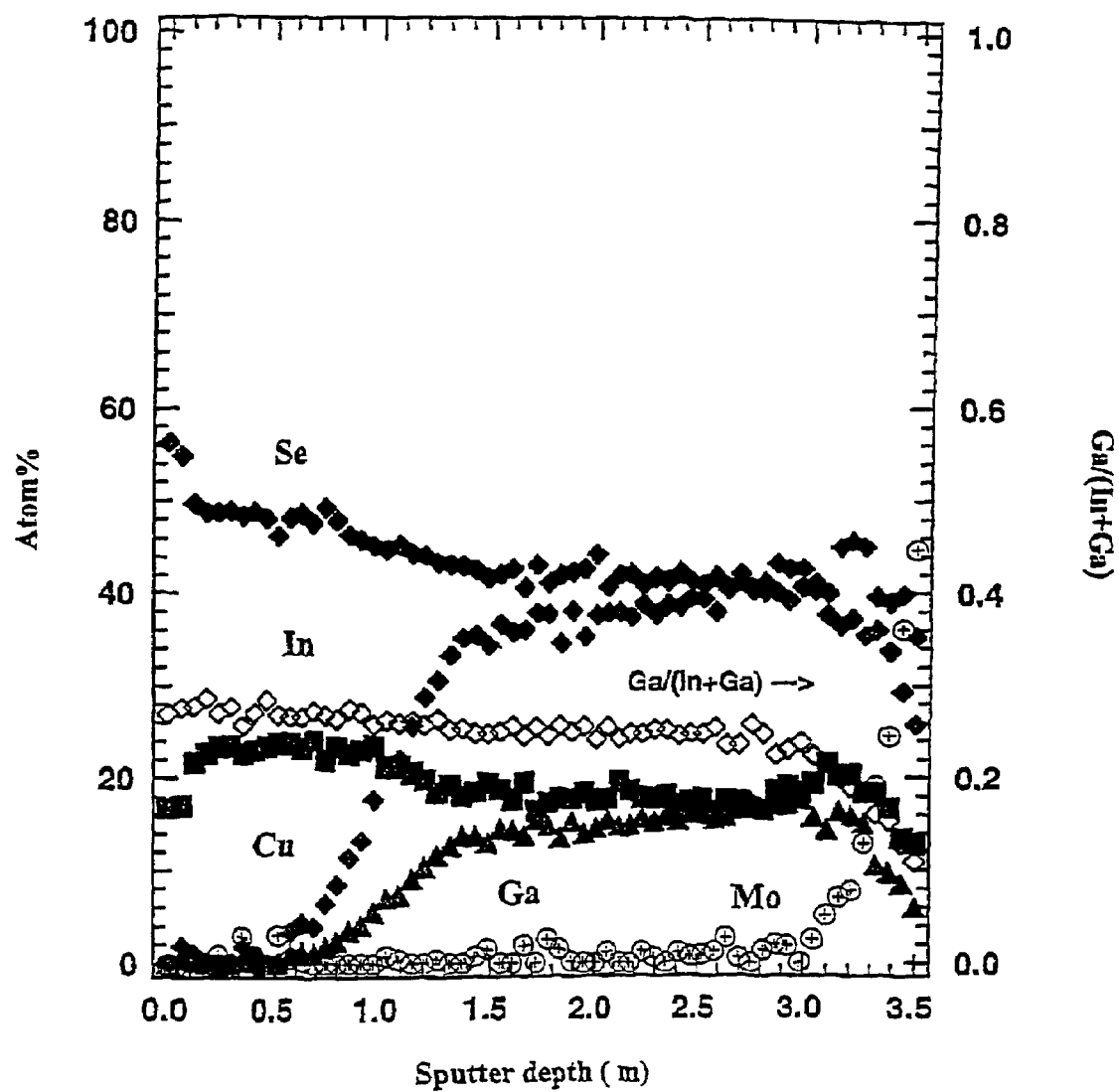
FIG. 4 graphically depicts the results of Auger electron spectroscopy analysis of a photovoltaic cell made according to the teachings of the present invention.

The electro-deposition bath of the present invention is a solution comprised of a buffer solution and a metal salt solution. In particular, the buffered solution of the present invention has a pH ranging from approximately 2-3. The buffered solution is comprised of potassium biphthalate and sulphamic acid. The biphthalate and sulphamic acid act to stabilize the chemical bath by reacting with free OH$^-$ and H$^+$ ions that exist in the electro-deposition bath as a result from the electrolysis of the water molecules in the bath. The undesirable electrolysis of water is particularly troublesome when high voltages are applied to the aqueous solution. As a result, the OH$^-$ or O$^{2-}$ ions generated by the electrolysis of water react with the metal ions to form metal oxides with the deposited metals or metal ions in solution. These metal oxides are contaminants that adversely affect the efficiency of the photovoltaic cell. To overcome this problem, the present invention utilizes a buffered solution to minimize the formation of metal oxides. Those skilled in the art will appreciate that other buffers may be utilized to maintain the pH of the solution and minimize the generation of metal oxides. The buffered electro-deposition solution of the present invention also provides a stable solution that allows for the consistent and uniform deposition of gallium. In general, FIG. 4 illustrates the atomic distribution of the film at various depths of the precursor layer using Auger electron spectroscopy. In particular, FIG. 4 shows an uniform layer of gallium from a depth of approximately 1.5-3.0 microns.

The metal salt solution of the present invention comprises salts of copper, indium, gallium, selenium, and lithium are dissolved in water. The resultant salt solution is then added to the buffered solution. In a preferred method of practice of the present invention, $CuCl_2$, $InCl_3$, $GaCl_3$, $H_2SeO_3$, and LiCl are dissolved in deionized water. Those skilled in the art will appreciate that supporting electrolytes such as NaCl or $Na_2SO_4$ may be suitable alternatives to LiCl.

In the discussion and claims that follow, electro-deposition potential is expressed in terms of a voltage without specifying positive or negative voltage. Those skilled in the art understand that the substrate or working electrode on which the thin film is deposited is to be connected as the electro-deposition cathode, and the counter electrode is connected as the anode. Accordingly, the electro-deposition voltages discussed herein are to be understood as negative voltages. In accordance with this convention, where electro-deposition voltages are expressed, for example, "at least one volt," this indicates that an electro-deposition voltage that is at least as negative as −1.0 volt with respect to the counter electrode is to be applied to the substrate. Discussing the electro-deposition voltages as unsigned voltages is to be understood as merely a shorthand way of referring to the absolute potential difference between the electrodes.

Once the electro-deposition bath of the present invention is prepared, the substrate is electroplated by applying a constant potential of approximately 0.7 V to 1.5 V. In an alternate method of practice, the precursor layer may be prepared using pulse DC at a high frequency. Films made in with pulse DC are prepared by using the following conditions: Vmax 1.32 V (Limit 3.00 V); Mmin: 1.27 V (Limit: 0 V); Frequency: 18 kHz (Limit: 0 to 20 KHz).

Another advantage of the buffered electro-deposition solution is that it simplifies the fabrication of the CIGS layer while producing efficient solar cells. Traditionally, the metal ion stoichiometry of the precursor layer is adjusted by physical vapor deposition (PVD) or by using a second electroplating solution. That is, the copper-indium-gallium-selenium composition that was initially deposited by the electro-deposition process is adjusted by the subsequent addition of gallium and indium by PVD. In contrast, the present invention contemplates the minimization or elimination of the PVD process. In one method of practice, an indium layer 18 of at least 2300 Angstroms is added by PVD. That is, the final composition of the CIGS layer is adjusted by adding indium by PVD which improves the efficiency of photovoltaic cell of the present invention. In an alternate practice of the present invention, the PVD step is eliminated. By eliminating the PVD step, the resultant photovoltaic cells are of comparable efficiency to those cells and they are more cost-effective. Those skilled in the art will appreciate that the efficient photovoltaic cells may be obtained by adjusting the total electro-deposition solution molarity, relative molarities of the constituents, pH, temperature, voltage, and electrolytic fluid.

After the CIGS layers have been deposited, a n-type layer 20 may be subsequently added. The n-type layer is typically a thin layer of a conducting oxide. The n-type layer or the "window" layer absorbs high-energy light. Ideally, the n-type layer should also be thin enough to allow light to reach the p-type layer. In order to satisfy these design requirements, the n-type layer must have a large band gap which will allow most of the light spectrum to reach the p-type layer. In one embodiment of the present invention, Cadmium Sulfide is used as a suitable n-type layer. In particular, a CdS layer at least 50 nm thick is deposited on the CIGS layer by chemical-bath deposition. Those skilled in the art will appreciate that different compounds and varying may be used to form the n-type layer.

Thereafter, an electrical contact layer 22 is applied to the n-type layer. Those skilled in the art will appreciate that one or more zinc oxide layers may be applied to the n-type layer.

In one embodiment of the present invention, two layers of zinc oxide is applied to the n-type layers. The first zinc oxide layer of approximately 50 nm is deposited by radio-frequency (RF) sputtering at approximately 0.62 watts/cm$^2$ in an argon plasma at 10 millitorrs pressure. The second zinc oxide layer of approximately 350 nm, comprising 1-5% $Al_2O_3$ doped zinc oxide, is also prepared by RF sputtering at approximately 1.45 watts/cm$^2$ in an argon plasma at 10 millitorrs pressure. In an exemplary embodiment, the resistivity of the first layer was 50-200 ohm/cm$^2$, and the resistivity of the second layer was 15-20 ohm/cm$^2$. The overall transmissivity of the zinc oxide layer is approximately 80-85%.

In order to complete the electrical circuit of the photovoltaic cell, electrodes 24 are applied to the electrical contact layer 22 by an electron-beam system or other techniques know by those skilled in the art. The electrodes are generally laid out in a grid-line pattern over the electrical contact layer. In a preferred embodiment of the present invention, the electrodes 24 may be formed from at least one metal. In particular, the electrodes may be comprised of a nickel/aluminum bilayer. The final step in the fabrication sequence is the deposition of anti-reflective coating 26 of approximately 100 nm. The anti-reflective coating is typically composed of $MgF_2$, but those skilled in the art will appreciate that the present invention contemplates other anti-reflective coatings.

EXAMPLE 1

A thin film having a precursor layer comprised of copper-indium-gallium-selenium was deposited onto a glass substrate having molybdenum layer deposited thereon. The thin film layer was obtained by electro-deposition. The electro-deposition bath is prepared by adding 10 gm of pHydrion™ buffers (Aldrich, St. Louis, Mo., catalog #23,901-1), which contains potassium biphthalate and sulphamic acid, was dissolved in 800 ml water. A solution having 0.6 gm $CuCl_2$, 1 gm $InCl_3$, 0.8 gm $GaCl_3$, 1 gm $H_2SeO_3$, and 10 gm LiCl was dissolved in 200 ml water. The metal ion solution and buffer solution were then mixed together. A three electrode system was used to deposit the precursor layer on the glass/Mo substrate wherein the glass/Mo substrate was used as the working electrode, platinum gauze was used as the counter electrode, and platinum was used as the pseudo-reference electrode. The electro-deposition voltage was at least 0.5 V. More particularly, a DC voltage of 0.9 V was applied for approximately one hour. The precursor composition is as follows: Cu: 26.18 atom %; In: 16.44 atom %; Ga: 9.43 atom %; and Se: 47.95 atom %.

Figure 2:
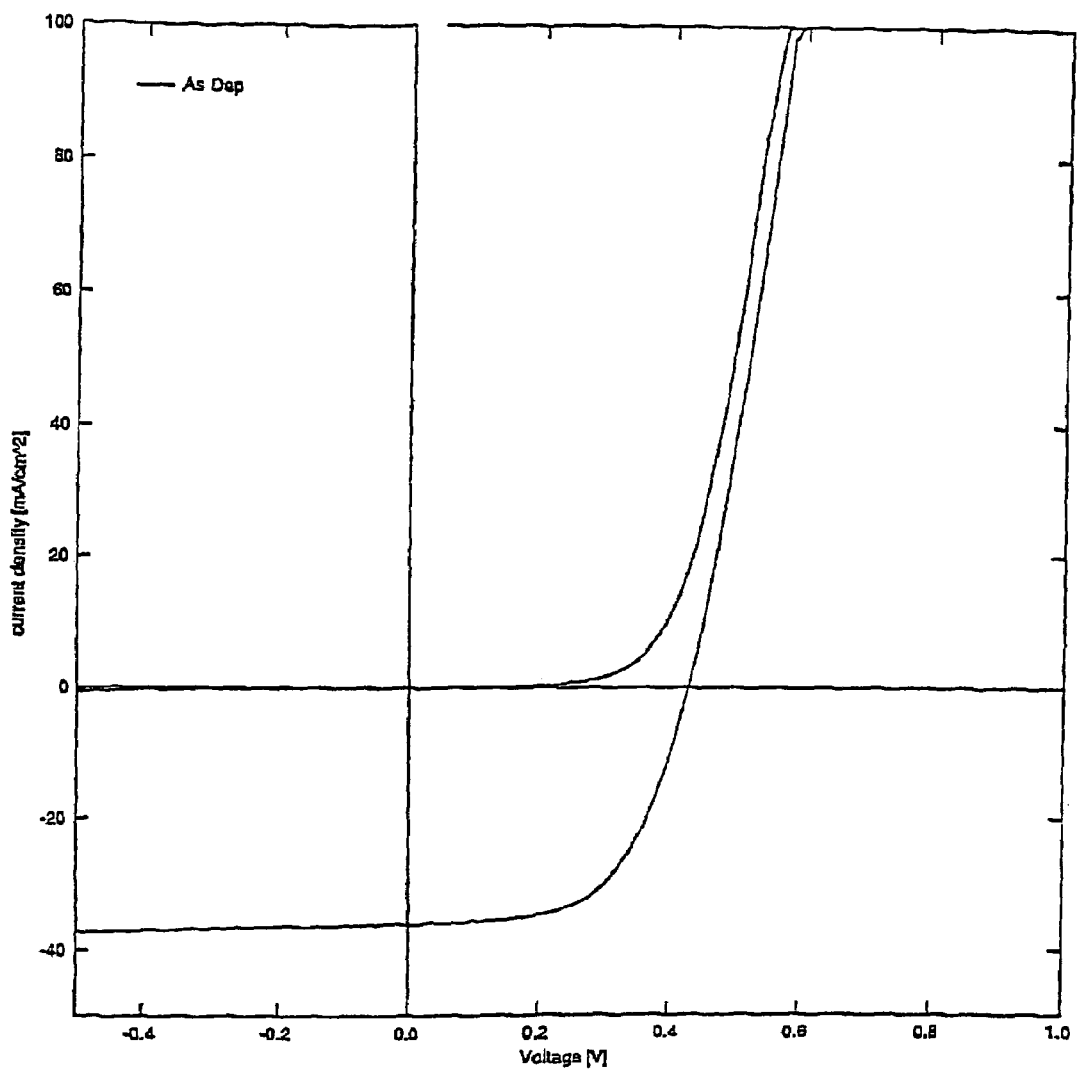
FIG. 2 graphically depicts the current density versus voltage of a photovoltaic cell made in accordance with the teachings of the present invention.

After electro-deposition, additional indium was added by PVD to adjust the final composition of Cu, In, Ga, and Se. Approximately 2300 Angstroms of indium was added in the PVD step. FIG. 2 shows the current density versus voltage of the finished cell. The cell exhibited an overall efficiency of 9.02%. Other performance parameters for this cell are listed in Table 1 below.

The photovoltaic device is completed by depositing approximately 50 nm of CdS by chemical bath deposition. Approximately 50 nm of ZnO is then applied to the CdS layer followed thereafter by approximately 350 nm of $Al_2O_3$ doped zinc oxide. A bilayer Ni/Al top contacts were deposited by e-beam system. The final step included the application of an anti-reflective coating of 100 nm of $MgF_2$.

EXAMPLE 2

Figure 3:
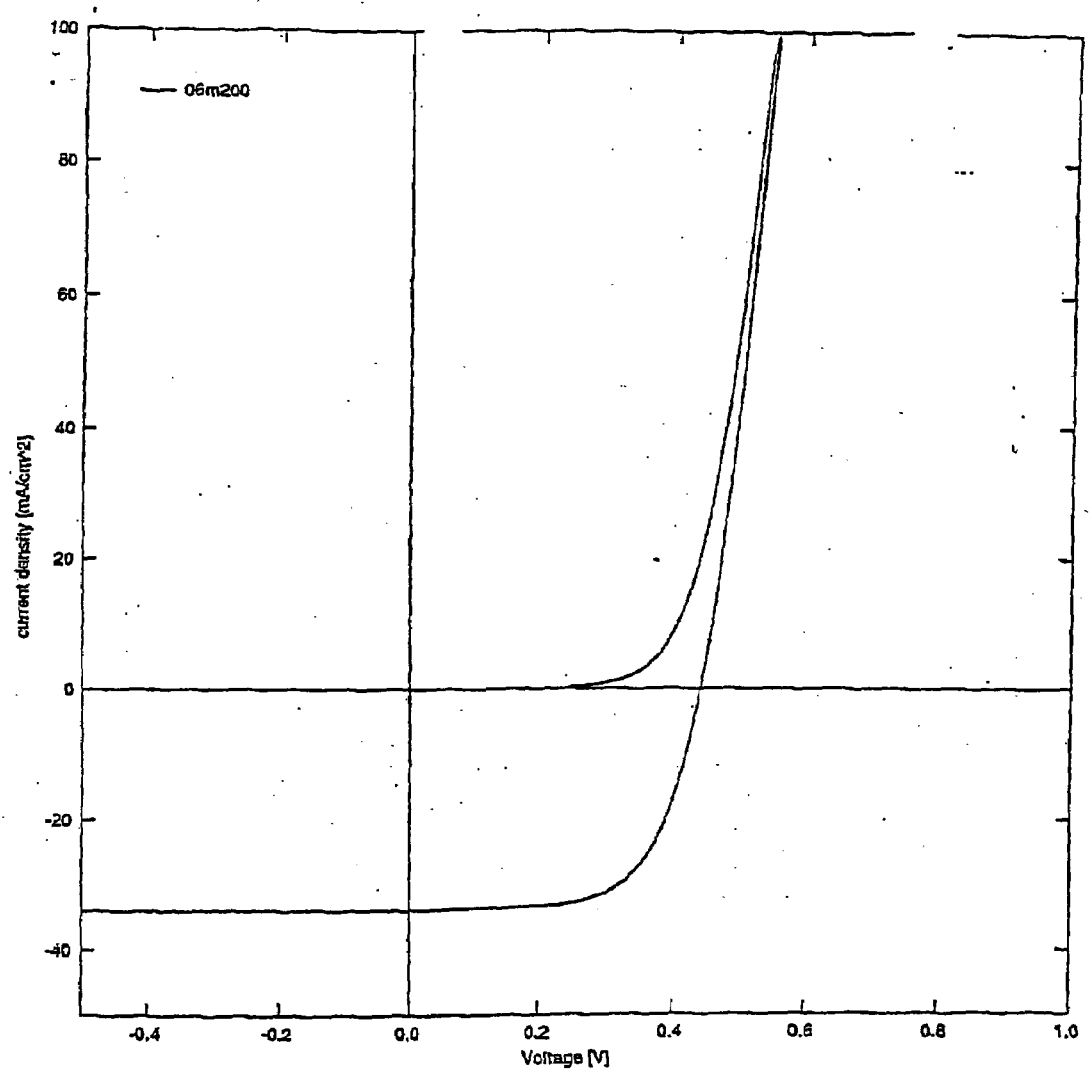
FIG. 3 graphically depicts the current density versus voltage of a photovoltaic bell made in accordance with the teachings of the present invention.

A photovoltaic cell was prepared according to Example 1, however 2400 Angstroms of indium was added in the PVD step. FIG. 3 shows the current density versus voltage of the finished cell having a 2400 Angstrom indium layer. The photovoltaic cell exhibited an overall efficiency of 9.02%. Other performance parameters for this cell are listed in Table 1 below.

TABLE 1

| Example | Area ($cm^2$) | $V_{oc}$ (mV) | $J_c$ ($mA/cm^2$) | Fill Factor (%) | Total Area Efficiency |
|---|---|---|---|---|---|
| 1 | 0.43 | 0.429 | 36.04 | 58.37 | 9.02 |
| 2 | 0.43 | 0.441 | 33.75 | 65.28 | 9.72 |

In closing, it is to be understood that the embodiments and examples of the invention disclosed herein are illustrative of the principles of the present invention. Other modifications that may be employed are within the scope of the invention; thus, by way of example, but not of limitation, alternative configurations of the photovoltaic cell or alternate methods of preparing photovoltaic cells are also contemplated. Accordingly, the present invention is not limited to that precisely as shown and described in the present invention.

What is claimed is:

1. A bath for forming a copper-indium-gallium-diselenide film comprising:
   an aqueous solution containing copper ions, indium ions, gallium ions and selenium ions and; and
   a buffer solution having a pH ranging from approximately 2-3 and containing potassium biphthalate and sulphamic acid.

2. The bath of claim 1 further including supporting electrolytes selected from LiCl, NaCl and $Na_2SO_4$.

3. A method for preparing a copper-indium-gallium-diselenide film comprising:
   providing a substrate;
   providing a buffered electro-deposition bath having a pH ranging from approximately 2-3 and containing ions of copper, indium, gallium, and selenide, and containing potassium biphthalate and sulphamic acid; and
   placing said substrate in said buffered electro-deposition bath to form a semiconductor layer having copper, indium, gallium, and selenide.

4. The method according to claim 3 wherein said substrate is selected from the group consisting of glass, amorphous glass, and soda-lime silica glass.

5. The method according to claim 4 further including applying a molybdenum layer to said substrate.

6. The method according to claim 5 further including adjusting said semiconductor layer composition by physical vapor deposition.

7. The method according to claim 5 further including adding indium to said semiconductor layer by physical vapor deposition.

8. A method for preparing a copper-indium-gallium-diselenide film comprising:
   providing a substrate;
   providing a buffered electro-deposition bath having a pH ranging from approximately 2-3 and containing ions of copper, indium, gallium, and selenide, and containing potassium biphthalate and sulphamic acid;
   placing said substrate in said buffered electro-deposition bath to form a semiconductor layer having copper, indium, gallium, and selenide; and
   depositing indium on said semiconductor layer by physical vapor deposition.

9. The method according to claim 8 wherein said substrate is selected from the group consisting of glass, amorphous glass, and soda-lime silica glass.

10. The method according to claim 9 further including applying a molybdenum layer to said substrate.

11. A method of fabricating a thin film photovoltaic device, comprising:
   (a) providing a substrate;
   (b) applying a molybdenum layer to said substrate by radio frequency sputtering;
   (c) providing a buffered electro-deposition bath having a pH ranging from approximately 2-3 and containing ions of copper, indium, gallium, and selenide, and containing potassium biphthalate and sulphamic acid;
   (d) placing said substrate in said buffered electro-deposition bath to form a semiconductor layer having copper, indium, gallium, and selenide;
   (e) adjusting said semiconductor layer composition by depositing indium by physical vapor deposition;
   (f) depositing a n-type semiconductor layer by chemical bath deposition on said semiconductor layer, wherein said n-type semiconductor layer is comprised of cadmium sulfide;
   (g) depositing a first zinc oxide layer by radio frequency sputtering to said n-type semiconductor layer;
   (h) depositing an aluminum oxide doped zinc oxide layer by radio frequency sputtering to said first zinc oxide layer;
   (i) applying a Nickel/Aluminum electrical contact layer to said aluminum oxide doped zinc oxide layer; and
   (j) depositing an anti-reflective coating composed of magnesium fluoride onto said electrical contact layer.

12. The method according to claim 11 wherein said substrate is selected from the group consisting of glass, amorphous glass, and soda-lime silica glass.

* * * * *